United States Patent
Seshadri et al.

(10) Patent No.: US 9,576,621 B2
(45) Date of Patent: Feb. 21, 2017

(54) READ-CURRENT AND WORD LINE DELAY PATH TRACKING FOR SENSE AMPLIFIER ENABLE TIMING

(71) Applicant: Texas Instruments Incorporated, Dallas, TX (US)

(72) Inventors: Anand Seshadri, Richardson, TX (US); Dharin Shah, Bangalore (IN); Parvinder Rana, Bangalore (IN); Wah Kit Loh, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 203 days.

(21) Appl. No.: 13/898,803

(22) Filed: May 21, 2013

(65) Prior Publication Data

US 2014/0010032 A1    Jan. 9, 2014

Related U.S. Application Data

(60) Provisional application No. 61/669,357, filed on Jul. 9, 2012.

(51) Int. Cl.
  *G11C 7/12* (2006.01)
  *G11C 8/08* (2006.01)
  (Continued)

(52) U.S. Cl.
  CPC . *G11C 7/12* (2013.01); *G11C 7/08* (2013.01); *G11C 7/227* (2013.01); *G11C 8/08* (2013.01)

(58) Field of Classification Search
  CPC .. G11C 11/41313; G11C 11/41; G11C 11/419; G11C 5/00; G11C 7/00; G11C 7/22; G11C 7/12; G11C 7/08; G11C 7/227; G11C 8/00; G11C 8/08; G11C 14/0054; G11C 29/24
  (Continued)

(56) References Cited

U.S. PATENT DOCUMENTS 5,841,720 A * 11/1998 Covino et al. ............. 365/210.1
6,285,604 B1 * 9/2001 Chang ......................... 365/200
  (Continued)

OTHER PUBLICATIONS

Arslan et al., "Variation-Tolerant SRAM Sense-Amplifier Timing Using Configurable Replica Bitlines", Custom Integrated Circuits Conference (IEEE, 2008), pp. 415-418.
  (Continued)

*Primary Examiner* — Alexander Sofocleous
*Assistant Examiner* — Alfredo Bermudez Lozada
(74) *Attorney, Agent, or Firm* — Rose Alyssa Keagy; Charles A. Brill; Frank D. Cimino

(57) ABSTRACT

A static random-access memory (SRAM) in an integrated circuit with circuitry for timing the enabling of sense amplifiers. The memory includes read/write SRAM cells, along with word-line tracking transistors arranged in one or more rows along a side of the read/write cells, and read-tracking transistors arranged in a column along a side of the read/write cells. A reference word line extends over the word-line tracking transistors, with its far end from the driver connected to pass transistors in the read-tracking transistors. The read-tracking transistors are preset to a known data state that, when accessed responsive to the reference word line, discharges a reference bit line, which in turn drives a sense amplifier enable signal.

17 Claims, 10 Drawing Sheets

(51) Int. Cl.
*G11C 7/08* (2006.01)
*G11C 7/22* (2006.01)

(58) Field of Classification Search
USPC .......................... 365/185.2, 185.21, 185.25,
189.04, 365/189.14, 189.2, 203, 210.1,
210.14, 230.06
See application file for complete search history.

(56) References Cited

U.S. PATENT DOCUMENTS

| | | | |
|---|---|---|---|
| 7,215,587 B2* | 5/2007 | Lee et al. | 365/200 |
| 8,004,878 B2* | 8/2011 | Asayama et al. | 365/154 |
| 8,040,746 B2* | 10/2011 | Jain et al. | 365/203 |

OTHER PUBLICATIONS

Amrutur et al., "A Replica Technique for Wordline and Sense Control in Low-Power SRAM's", J. Solid State Circuits, vol. 33, No. 8 (IEEE, 1998), pp. 1208-1219.

* cited by examiner

READ-CURRENT AND WORD LINE DELAY PATH TRACKING FOR SENSE AMPLIFIER ENABLE TIMING

CROSS-REFERENCE TO RELATED APPLICATIONS

This application claims priority, under 35 U.S.C. §119(e), of Provisional Application No. 61/669,357, filed Jul. 9, 2012, and incorporated herein by this reference.

STATEMENT REGARDING FEDERALLY SPONSORED RESEARCH OR DEVELOPMENT

Not applicable.

BACKGROUND OF THE INVENTION

This invention is in the field of solid-state memories. Embodiments of this invention are more specifically directed to the sensing of stored data states in such memories.

Many modern electronic devices and systems now include substantial computational capability for controlling and managing a wide range of functions and useful applications. The computational power of these modern devices and systems is typically provided by one or more processor "cores". These processor cores operate as a digital computer, in general retrieving executable instructions from memory, performing arithmetic and logical operations on digital data retrieved from memory, and storing the results of those operations in memory. Other input and output functions for acquiring and outputting the data processed by the processor cores are performed as appropriate. Considering the large amount of digital data often involved in performing the complex functions of these modern devices, significant solid-state memory capacity is now commonly implemented in the electronic circuitry for these systems.

Static random access memory (SRAM) has become the memory technology of choice for much of the solid-state data storage requirements in these modern power-conscious electronic systems. As is fundamental in the art, SRAM cells store contents "statically", in that the stored data state remains latched in each cell so long as power is applied to the memory; this is in contrast to "dynamic" RAM ("DRAM"), in which the data must be periodically refreshed in order to be retained.

FIG. 1a illustrates an example of a conventional SRAM cell 2, which is constructed in the well-known six-transistor (6-T) arrangement. In this example, cell 2 is in the $j^{th}$ row and $k^{th}$ column of a memory array of similar cells, and is biased between the voltage on power supply line $V_{dda}$ and a ground reference voltage $V_{ssa}$. SRAM memory cell 2 is constructed in the conventional manner as a pair of cross-coupled CMOS inverters, one inverter of series-connected p-channel load transistor 3a and n-channel driver transistor 4a, and the other inverter of series-connected p-channel load transistor 3b and n-channel transistor 4b; in the usual manner, the gates of the transistors in each inverter are connected together and to the common drain node of the transistors in the other inverter. The common drain node of transistors 3a, 4a constitutes storage node SNT, and the common drain node of transistors 3b, 4b constitutes storage node SNB, in this example. N-channel pass transistor 5a has its source/drain path connected between storage node SNT and bit line $BLT_k$ for the $k^{th}$ column, and n-channel pass transistor 5b has its source/drain path connected between storage node SNB and bit line $BLB_k$. The gates of pass transistors 5a, 5b are driven by word line $WL_j$ for this $j^{th}$ row in which cell 2 resides.

Bit lines $BLT_k$, $BLB_k$ are shared by other cells 2 in the same column k, and are connected (typically via transfer gates, and perhaps also by way of column select circuitry, neither shown in FIG. 1a) to sense amplifier 12. Sense amplifier 12 is constructed similarly as cell 2, in that it includes a pair of cross-coupled inverters: one inverter being series-connected p-channel load transistor 13a and n-channel driver transistor 14a, and the other inverter of series-connected p-channel load transistor 13b and n-channel transistor 14b. The gates of the transistors in each inverter are connected together and to the common drain node of the transistors in the other inverter, in the usual manner. In sense amplifier 12, the common drain node of transistors 13a, 14a constitutes sense node ST, which is coupled to bit line $BLT_k$, while the common drain node of transistors 13b, 14b constitutes storage node SB, coupled to bit line $BLB_k$. In contrast to cell 2, however, ground bias is applied to sense amplifier 12 via n-channel MOS enable transistor 15, which has its drain connected to the source nodes of transistors 14a, 14b, and its source at ground voltage $V_{ss}$. The gate of enable transistor 15 receives sense amplifier enable signal SAE.

In its normal operation, bit lines $BLT_k$, $BLB_k$ are typically precharged by precharge circuitry 7 to a high voltage $V_{ddp}$ (which is at or near power supply voltage $V_{dda}$) and are equalized to that voltage; precharge circuitry 7 then releases bit lines $BLT_k$, $BLB_k$ to then float during the remainder of the access cycle. During this time, sense amplifier enable signal SAE is inactive low, turning off enable transistor 15, which disables the operation of sense amplifier 12. To access cell 2 for a read operation, word line $WL_j$ is then energized, turning on pass transistors 5a, 5b, and connecting storage nodes SNT, SNB to bit lines $BLT_k$, $BLB_k$. Upon sense amplifier enable signal SAE being driven active high, the differential voltage developed on bit lines $BLT_k$, $BLB_k$ by selected cell 2 is sensed and amplified by the cross-coupled inverters of sense amplifier 12. To write data, typical SRAM memories also include write circuitry that pulls one of bit lines $BLT_k$, $BLB_k$ low (i.e., to a voltage at or near ground voltage $V_{ssa}$), depending on the data state to be written. Upon word line $WL_j$ then being energized, the low level bit line $BLT_k$ or $BLB_k$ will pull down its associated storage node SNT, SNB, causing the cross-coupled inverters of addressed cell 2 to latch in the desired state.

In any type of solid-state semiconductor memory, the sensing of data stored in a selected memory cell is a critical operation. Accurate sensing of the stored memory cell state must be maintained over varying voltage and temperature conditions, variations in manufacturing parameters, and in the presence of system noise. As a result, the precision of the sense circuitry plays a role in determining the memory density in bits per unit "chip" area (and thus in the cost-per-bit of manufacturing the memory), because the noise margin of the sense circuitry determines, in large part, the minimum memory cell size required to provide the necessary read current. The timing of the sense operation in an SRAM constructed as shown in FIG. 1a has become especially critical as transistor feature sizes have continued to shrink.

FIG. 1b is a timing diagram illustrating an example the timing of sense amplifier enable signal SAE relative to the access of a conventional SRAM cell 2. In this example, SRAM cell 2 of FIG. 1a is storing a "0" data state (i.e., storage node SNT is at a low "0" level, and storage node SNB is at a high "1" logic level), and is being read during a read cycle in which its row j is selected. At the beginning of the cycle shown in FIG. 1b, for example at time $t_0$, bit lines $BLT_k$, $BLB_k$ are both precharged to a high logic level by bit line precharge circuitry 7. Word line $WL_j$ is at a low logic level, maintaining pass transistors 5a, 5b off In SRAM cell $50_{jk}$ in this example, storage nodes SNT, SNB will be at full "0" and "1" logic levels, respectively, corresponding to the stored "0" data state. Because pass transistors 5a, 5b are both off with word line $WL_j$ low, the precharged levels at bit lines $BLT_k$, $BLB_k$ are isolated from storage nodes SNT, SNB. Sense amplifier enable signal SAE is at an inactive low level at this time, disabling the operation of sense amplifier 12.

In this example, word line $WL_j$ is energized to a high logic level at time $t_1$, to select row j including cell 2. Pass transistors 5a, 5b couple storage nodes SNT, SNB to their respective bit lines $BLT_k$, $BLB_k$. Cell 2 is storing a "0" data state in this example, and as such, upon word line $WL_j$ being energized and pass transistor 5a being turned on, the voltage at bit line $BLT_k$ will be affected by the low level at storage node SNT. For this data state, in which high logic level is driven at storage node SNB, bit line $BLT_k$ begins to be discharged by driver transistor 4a of cell 2 when pass transistor 5a is turned on by word line $WL_j$ after time $t_1$. Because driver transistor 4b will be off for this data state, bit line $BLB_k$ will not be significantly discharged from its precharged high level.

Three possible timings of sense amplifier enable signal SAE are shown in FIG. 1b, by way of example. At time $t_{early}$, the differential voltage $\Delta V1$ at bit lines $BLT_k$, $BLB_k$ is quite small, as compared with the differential voltages $\Delta V2$, $\Delta V3$ at later times $t_x$ and $t_{late}$ respectively. If sense amplifier enable signal SAE is driven high at time $t_{early}$, the sensing operation by sense amplifier 12 is vulnerable to error caused by noise of a magnitude greater than the small bit line differential voltage $\Delta V1$ at that time. On the other hand, the driving of sense amplifier enable signal SAE high at time $t_{late}$ may be later than necessary for reliable sensing over the voltage and temperature range of the memory. For example, if differential bit line voltage $\Delta V2$ provides sufficient noise margin to the sensing operation, the larger differential bit line voltage $\Delta V3$ may not provide any practical benefit. In this case, the later sense time $t_{late}$ would unduly lengthen the read access time by the delay of time $t_{late}$ from the optimal time $t_x$.

It has been observed that the design of modern SRAM circuitry to optimally time the driving of the sense amplifier control signal can be quite difficult. Various conventional techniques for interlocking the sense control signal in SRAM devices have been developed.

FIG. 1c illustrates one conventional approach for determining sense amplifier timing. In this example of memory array 20, one row is selected by one of row drivers 17, corresponding to the row address decoded by row decoder 16, driving an active level on a word line WL. As described above, each sense amplifier 12 is enabled by a corresponding enable transistor 15 that receives sense amplifier enable signal SAE at its gate. In this example, sense amplifier enable signal SAE is driven by inverter chain 19, which receives a row enable control signal ROW_EN that gates each of row drivers 17. In operation, in response to a low-to-high transition of row enable control signal ROW_EN, the row driver 17 addressed by row decoder 16 will drive its associated word line WL to an active high level, turning on the pass transistors in each cell in that row. The low-to-high transition of row enable signal ROW_EN is also received by inverter chain 19, which in turn, after the propagation delay through the inverters in inverter chain 19, initiates sense amplifier enable signal SAE that is applied to the gates of enable transistors 15.

While the conventional solution shown in FIG. 1c can be designed to nominally generate sense amplifier enable signal SAE at a desired time, this approach is subject to certain limitations. A first such limitation stems from the difference in construction between the memory cell transistors (i.e., load transistors 3a, 3b; driver transistors 4a, 4b; pass transistors 5a, 5b) in array 20 and the "logic" transistors that make up inverter chain 19 outside of array 20. In modern integrated circuits, in which significant differences in channel lengths, threshold voltages, and the like are incorporated into the ultimate structure, the electrical characteristics of the logic transistors will differ from those of the cell transistors that the logic transistor behavior will not closely match that of the array transistors. In integrated circuits realized at modern sub-micron feature sizes, the smaller cell transistors are generally not permitted outside of the array boundaries due to their significant differences in design rules and manufacturability, which prohibits the fabrication of inverter chain 19 using cell transistors; in addition, it has been observed that localized variation in device behavior of the small geometry cell transistors can be significant, which reduces the benefit of realizing inverter chain 19 using cell transistors outside of the array even if it were permitted. This mismatch is exacerbated in state of the art technologies, in which the cell transistors within array 20 and logic transistors outside of array 20 are fabricated largely with independent processes, such as different pocket or Vt-adjust ion implants, different gate dielectric processing (e.g., fluorinated gate oxide in the cell transistors), and the application of transistor length biasing to one transistor type but not the other. These processing differences reduce the correlation of logic transistors to cell transistors even further, worsening the ability of inverter chain 19 to adjust sense amplifier timing in response to process variations. As such, designs that rely on an inverter chain or other logic transistor delay stages external to the memory for sense amplifier timing will necessarily include some additional design margin (i.e., additional delay in generating sense amplifier enable signal SAE), which adversely impacts read access times.

FIG. 1d illustrates another conventional approach to determining sense amplifier timing. In this example, rather than inverter chain 19 of FIG. 1c, replica row drivers 22 receive the row enable control signal ROW_EN, and drive reference word lines RWL applied to replica mini-array 24 accordingly. Replica mini-array 24 is a small array of "dummy" memory cells, constructed using the same transistor sizes as in main array 20, but located outside of array 20. One or more of those "dummy" memory cells have hard-wired data states that are reflected on reference bit lines RBL. Reference bit lines RBL are connected to inputs of sense driver 25, which drives sense amplifier enable signal SAE upon receiving the communicated data state of the "addressed" dummy memory cells. Typically, multiple dummy cells along one or more columns of replica mini-array 24 are ganged together to minimize the effects of local device variation.

In operation, reference word lines RWL are driven high by replica row drivers 22 in response to a transition of row enable control signal ROW_EN. Upon reference word lines RWL charging to a sufficient voltage to turn on pass transistors in the associated dummy memory cells, and upon the accessed dummy memory cells discharging reference bit lines RBL to a low level, sense driver 25 then asserts sense amplifier enable signal SAE. This conventional approach improves on the inverter chain delay stage of FIG. 1c, by theoretically constructing the delay elements similarly as the cell transistors in main array 20, thus providing a proxy for the effects of the parasitic impedance of reference word lines WL, bit line transistors, and cell transistors. However, the chip area required to implement replica mini-array 24 can be significant, especially in those technologies requiring dummy cells at the edge of the replica memory cells in order to absorb proximity effects, or to implement terminations and "keepouts". And while replica mini-array 24 will mimic the parasitic resistance and capacitance of the word lines and bit lines of main array 20, it is still only a proxy for those effects, and will not necessarily match all process, voltage, and temperature variations. Furthermore, this construction will not track on-chip variations in read current among the cells of main array 20. Accordingly, the approach of FIG. 1d is contemplated to be an expensive (in chip area) technique for generating sense amplifier enable signal SAE, while still not closely matching or tracking the actual optimum timing.

Arslan et al., "Variation-Tolerant SRAM Sense-Amplifier Timing Using Configurable Replica Bitlines", *Custom Integrated Circuits Conference* (IEEE, 2008), pp. 415-418, describes the incorporation of a replica column of memory cells implemented in or adjacent to the main memory array, in which the discharge of the replica bit line by a configurable number of dummy memory cells in that column drives the sense amplifier enable signal. Amrutur et al., "A Replica Technique for Wordline and Sense Control in Low-Power SRAM's", *J. Solid State Circuits*, Vol. 33, No. 8 (IEEE, 1998), pp. 1208-19, describes a row of replica cells implemented in or adjacent to the main memory array, for which a dummy global word line is driven along with the global word line for the main array. The discharge of replica bit lines by replica memory cells selected by the dummy global word line drives the sense amplifier enable signal.

BRIEF SUMMARY OF THE INVENTION

Embodiments of this invention provide a memory architecture and method of operating the same in which the sense amplifier timing of a static random access memory (SRAM) is generated a manner that tracks variations in bit line and word line parasitic capacitance and resistance within the memory array.

Embodiments of this invention provide such a memory and method in which replica memory cells on which the sense amplifier timing is based can be efficiently realized in an integrated circuit.

Embodiments of this invention provide such a memory and method in which variations in read current within the memory array are tracked in the generation of the sense amplifier timing.

Other objects and advantages of embodiments of this invention will be apparent to those of ordinary skill in the art having reference to the following specification together with its drawings.

Embodiments of this invention may be implemented into a memory architecture in which the memory array includes a reference row of word-line tracking memory cells and a reference column of read-tracking memory cells, in addition to the rows and columns of memory cells for storing data. A reference word line, driven by a separate reference word line driver, for example in response to a row enable signal, runs along the reference row. The read-tracking cells in the reference column are each coupled to a reference bit line in response to an active level at the terminal end of the reference word line, after its run along the reference row. Access of one or more memory cells along the reference column is reflected at the reference bit line, which in turn enables sense amplifiers for sensing data read from one or more columns of memory cells in the array.

BRIEF DESCRIPTION OF THE SEVERAL VIEWS OF THE DRAWING

FIG. 1b is a timing diagram illustrating the sensing of data from the memory cell in the architecture of FIG. 1a.

DETAILED DESCRIPTION OF THE INVENTION

This invention will be described in connection with one or more of its embodiments, namely as implemented into static random access memory (SRAM) cells of the complementary metal-oxide-semiconductor (CMOS) type, as it is contemplated that this invention is especially beneficial when implemented in that context. However, it is also contemplated that this invention can provide benefit in other circuit and structure applications, including without limitation memory cells that have other types of asymmetric read and write buffers, or that include transistors that are otherwise are vulnerable to asymmetric contexts. Accordingly, it is to be understood that the following description is provided by way of example only, and is not intended to limit the true scope of this invention as claimed.

Figure 2:
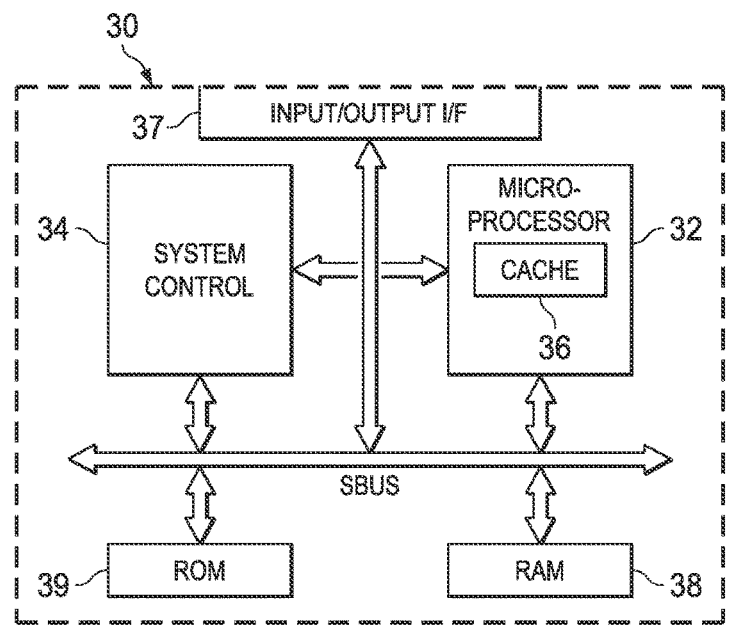
FIG. 2 is an electrical diagram, in block form, of a large scale integrated circuit constructed according to embodiments of this invention.

FIG. 2 illustrates an example of large-scale integrated circuit 30, in the form of a so-called "system-on-a-chip" ("SoC"), as now popular in many electronic systems. Integrated circuit 30 is a single-chip integrated circuit into which an entire computer architecture is realized. As such, in this example, integrated circuit 30 includes a central processing unit of microprocessor 32, which is connected to system bus SBUS. Various memory resources, including random access memory (RAM) 38 and read-only memory (ROM) 39, reside on system bus SBUS and are thus accessible to microprocessor 32. ROM 39 may be realized as mask-programmed ROM, electrically erasable programmable read-only memory (EEPROM) such as "flash" EEPROM, or the like, and typically serves as program memory, storing the program instructions executable by microprocessor 32, while RAM 38 serves as data memory. In some cases, program instructions may reside in RAM 38 for recall and execution by microprocessor 32. Cache memory 36 (such as level 1, level 2, and level 3 caches, each typically implemented as SRAM) provides another memory resource, and resides within microprocessor 32 itself and therefore does not require bus access. Other system functions are shown, in a generic sense, in integrated circuit 30 by way of system control 34 and input/output interface 37.

Those skilled in the art having reference to this specification will recognize that integrated circuit 30 may include additional or alternative functions to those shown in FIG. 2, or may have its functions arranged according to a different architecture from that shown in FIG. 2. The architecture and functionality of integrated circuit 30 is thus provided only by way of example, and is not intended to limit the scope of this invention.

Figure 3:
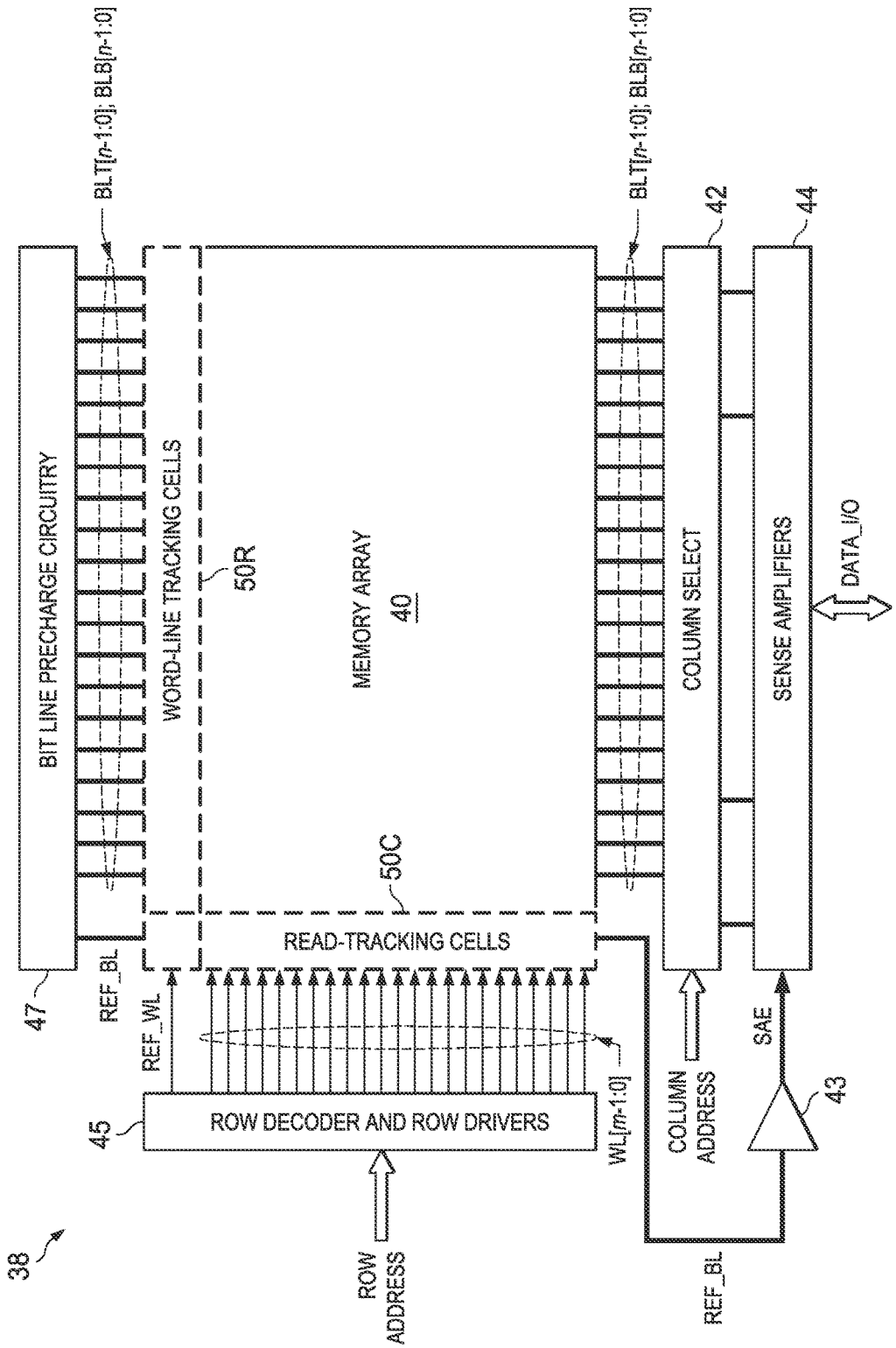
FIG. 3 is an electrical diagram, in block form, of a memory resource in the integrated circuit of FIG. 2, constructed according to embodiments of this invention.

Further detail in connection with the construction of RAM 38 in integrated circuit 30 is illustrated in FIG. 3. Of course, a similar construction may be used to realize other memory resources such as cache memory 36; further in the alternative, RAM 38 may correspond to a stand-alone memory integrated circuit (i.e., rather than as an embedded memory as shown in FIG. 2). Those skilled in the art having reference to this specification will comprehend that the memory architecture of RAM 38 in FIG. 3 is provided by way of example only.

Figure 1A:
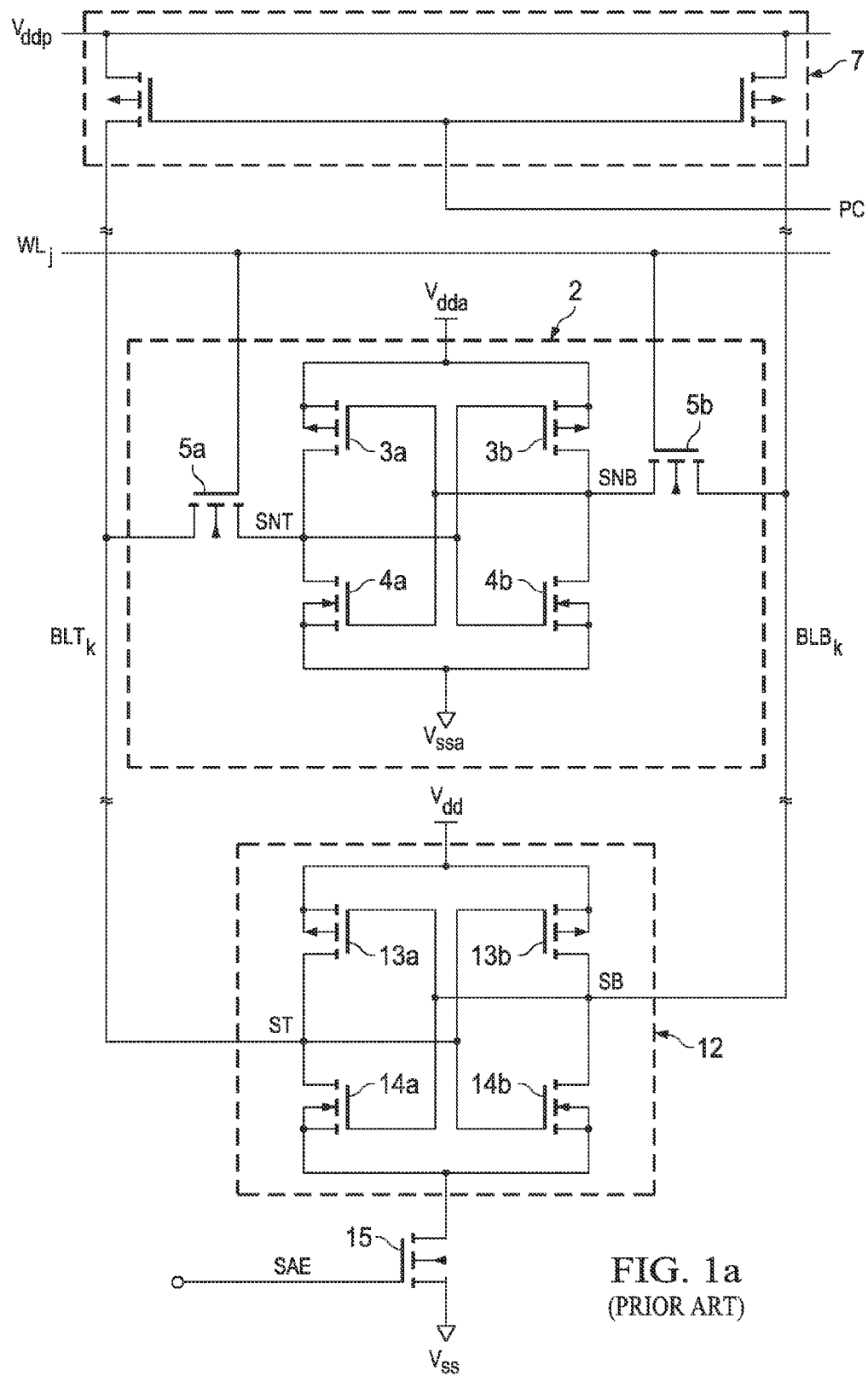
FIG. 1a is an electrical diagram, in schematic form, of a conventional static random access memory (SRAM) cell in a conventional memory architecture.
Figure 1B:
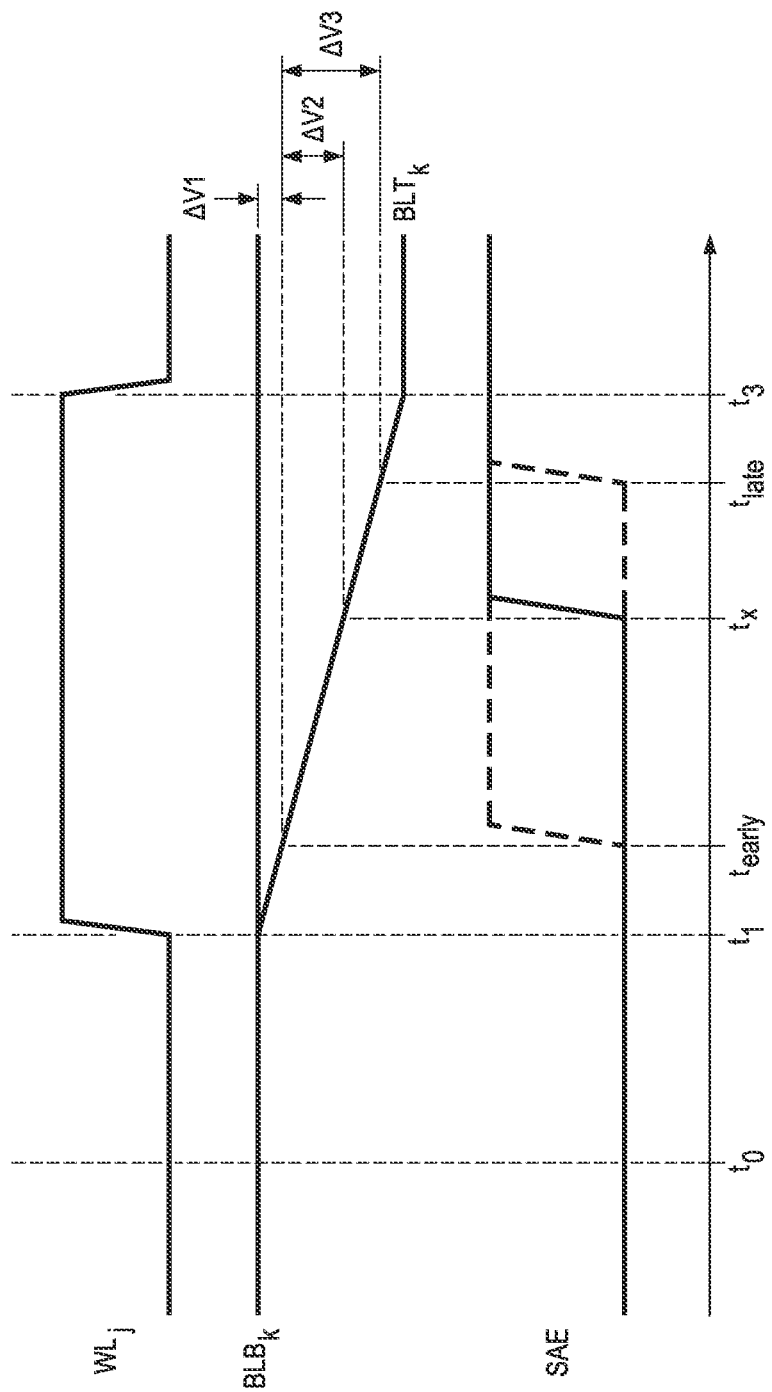
Figure 1C:
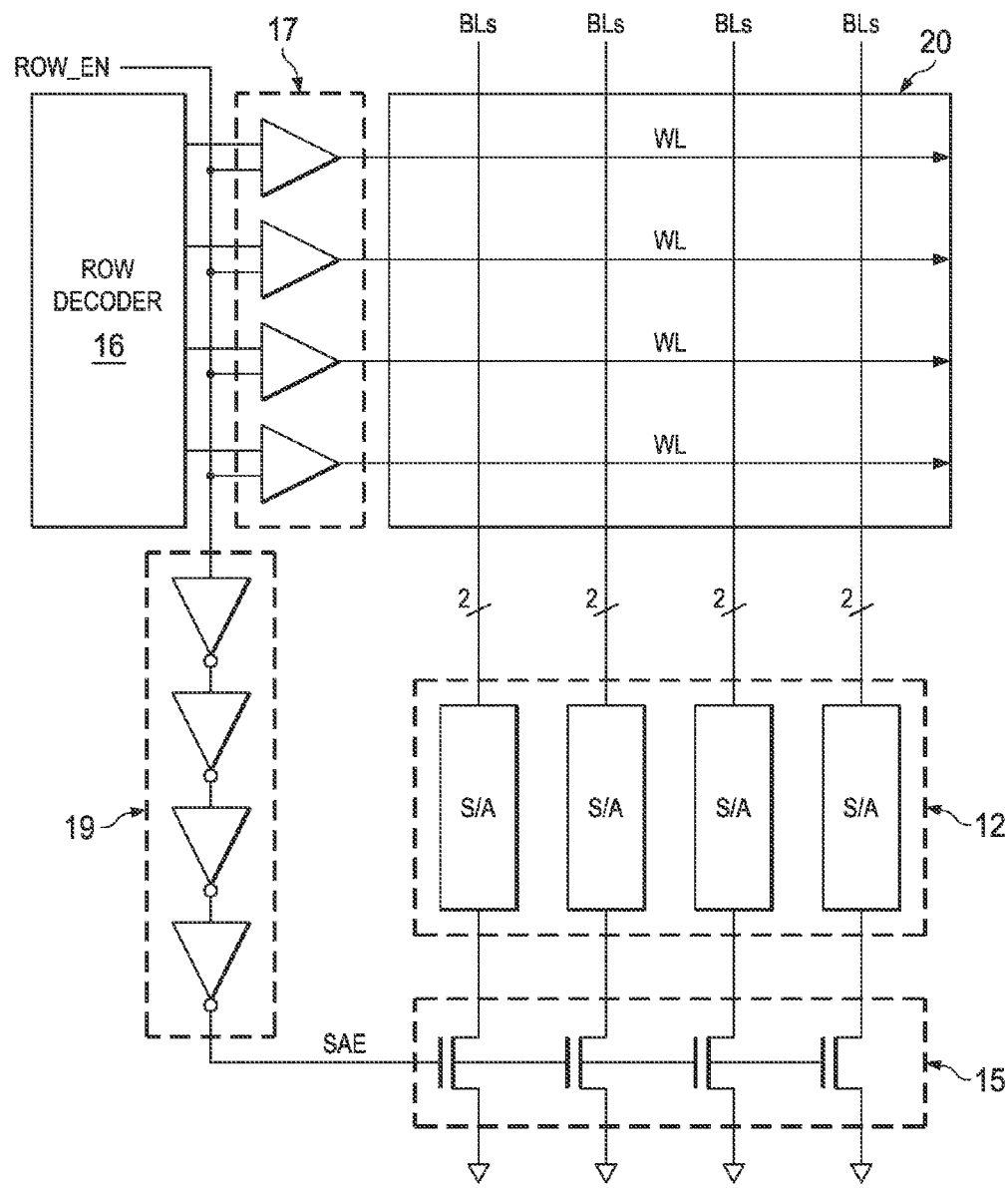
FIGS. 1c and 1d are electrical diagrams, in block and schematic form, of conventional SRAM memory architectures.
Figure 1D:
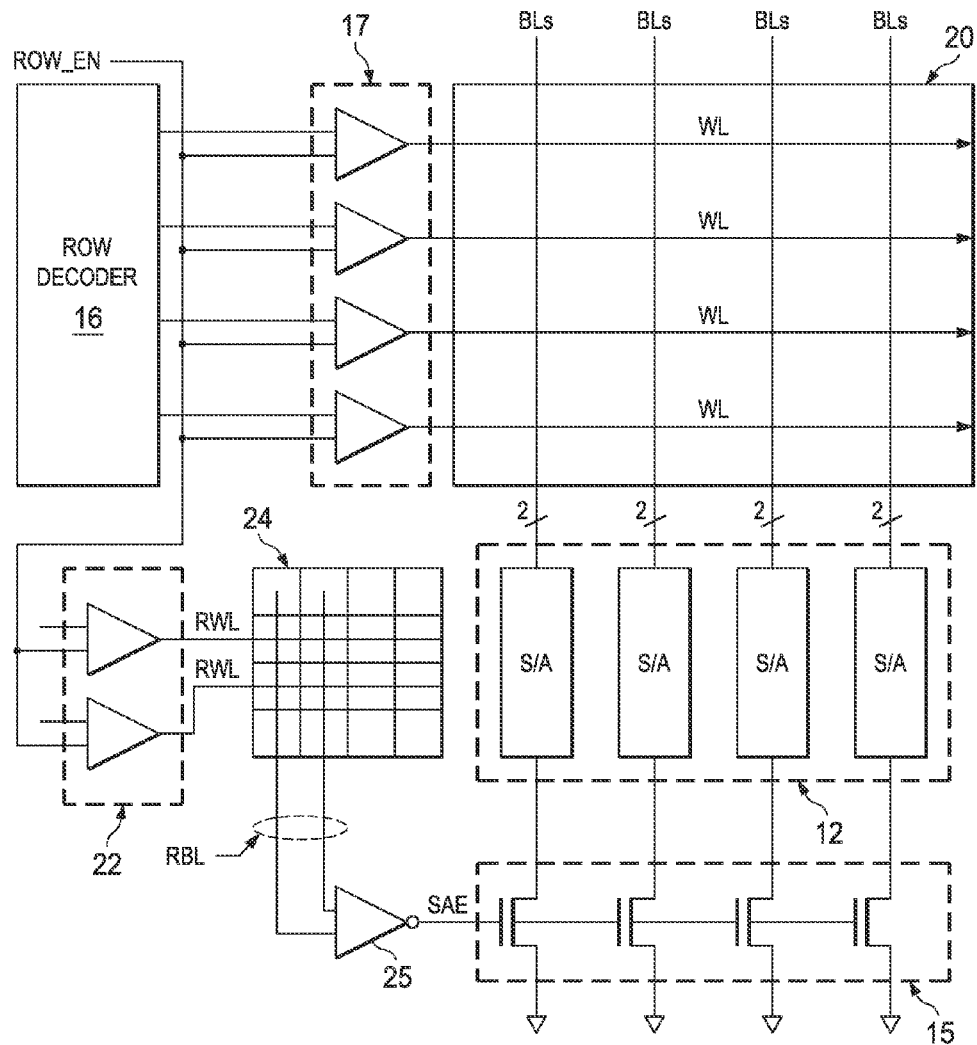

In this example, RAM 38 includes memory array 40 containing memory cells arranged in rows and columns. While a single instance of memory array 40 is shown in FIG. 3, it is to be understood that RAM 38 may include multiple memory arrays 40, each corresponding to a memory block within the address space of RAM 38. In the example shown in FIG. 3, memory array 40 includes a sub-array including m rows and n columns of "live" read/write SRAM cells (i.e., capable of being written to and read from), with cells in the same column sharing a pair of bit lines BLT[n-1:0], BLB[n-1:0], and with memory cells in the same row sharing one of word lines WL[m-1:0]. Of course, memory array 40 may be arranged to include multiple array blocks or sub-arrays that include read/write cells, depending on the addressing space or memory architecture. Bit line precharge circuitry 47 is provided to apply a desired precharge voltage to bit lines BLT[n-1:0], BLB[n-1:0], in advance of read and write operations. Row decoder and word line drivers 45 receive a row address value indicating the row of memory array 40 to be accessed, and energizes the one of word lines WL[m-1:0] corresponding to that row address value. Column select circuit 42 receives at least a portion of a column address value, and in response selects bit lines BLT[n-1:0], BLB[n-1:0] associated with one or more columns to be placed in communication with read/write circuits 44. Sense amplifiers 44 are coupled to the bit lines BLT[n-1:0], BLB[n-1:0] for a column as selected by column select circuit 42, and are constructed in the conventional manner, for example including cross-coupled inverters with a enable transistor as described above relative to FIG. 1*a*. Write circuitry (not shown) will also be provided in RAM 38, including conventional circuitry for selectively pulling toward ground one of bit lines BLT[n-1:0], BLB[n-1:0] in the selected pair according to the input data state to be written.

The example of RAM 38 shown in FIG. 3 is constructed according to an "interleaved" architecture, in which a given memory address selects one of every x (e.g., one of every four) columns for read or write access. The data words stored in memory array 40 are thus interleaved with one another, in the sense that the memory address decoded (in part) by column select circuit 42 selects one column in each group of columns, along the selected row. Alternatively, memory array 40 may be arranged in a non-interleaved fashion, in which each cell in the selected row is coupled to one of sense amplifiers 44 (and write circuitry) in each cycle. In that architecture, column select circuits 42 would be located downstream from sense amplifiers 22, and would select which sense amplifiers 44 (and thus which columns) are in communication with data bus DATA I/O.

According to embodiments of this invention, memory array 40 includes word-line tracking cells 50R arranged in a row along one side of the sub-array of read/write cells 50, and read-reference cells 50C arranged in a column along another side of that sub-array. In this embodiment of the invention, word-line tracking cells 50R are each coupled to reference word line REF_WL driven from row decoders and drivers 45. In addition, as will be described in further detail below, one or more read-tracking cells 50C are also coupled to reference word line REF_WL at a point after it has traveled the equivalent length of a row of word-line tracking cells 50R. Read-tracking cells 50C are also connected to reference bit line REF_BL, which is precharged by bit line precharge circuitry 47 similarly as bit lines BLT[n-1:0], BLB[n-1:0], and which will be discharged by those read-tracking cells 50C receiving reference word line REF_WL. Reference bit line REF_BL is in turn applied to inverting buffer 43, which in turn drives sense amplifier enable signal SAE.

As such, according to this embodiment of the invention, the timing of the sense amplifier enable signal SAE in each read cycle is responsive to reference word line REF_WL charging over the equivalent length of a full row of word-line tracking cells 50R, followed by read-tracking cells 50C discharging reference bit line REF_BL from its precharged level. As discussed above and as will be described in further detail below, word-line tracking cells 50R and read-tracking cells 50C are embedded within memory array 40, close to and similarly constructed as read/write cells 50. Because of that embedding and similarity, and also because of the similar loading of reference word line REF_WL to that of word lines WL[m-1:0] and the similar loading of reference bit line REF_BL to that of bit lines BLT[n-1:0], BLB[n-1:0], it is contemplated that the timing of sense amplifier enable signal SAE will closely track changes in the electrical characteristics of the read/write cells in memory array 40 over variations in manufacturing process parameters, voltage, temperature, and other conditions. The accuracy of the sense amplifier timing according to embodiments of this invention is further enhanced because the timing of the read current discharging reference bit line REF_BL is based on the delay at the end of reference word line REF_WL (i.e., at the terminal end of its length corresponding to a full row of read/write cells 50), thus accounting not only for capacitive word line loading by also for the series resistance of the full length of a word line. As will also be apparent from the description below, this excellent tracking can be attained efficiently from the standpoint of chip area, according to embodiments of this invention. Furthermore, the construction and arrangement of tracking cells 50R, 50C can be made specific to each compiled memory instance within large-scaled integrated circuit 10.

Figure 4:
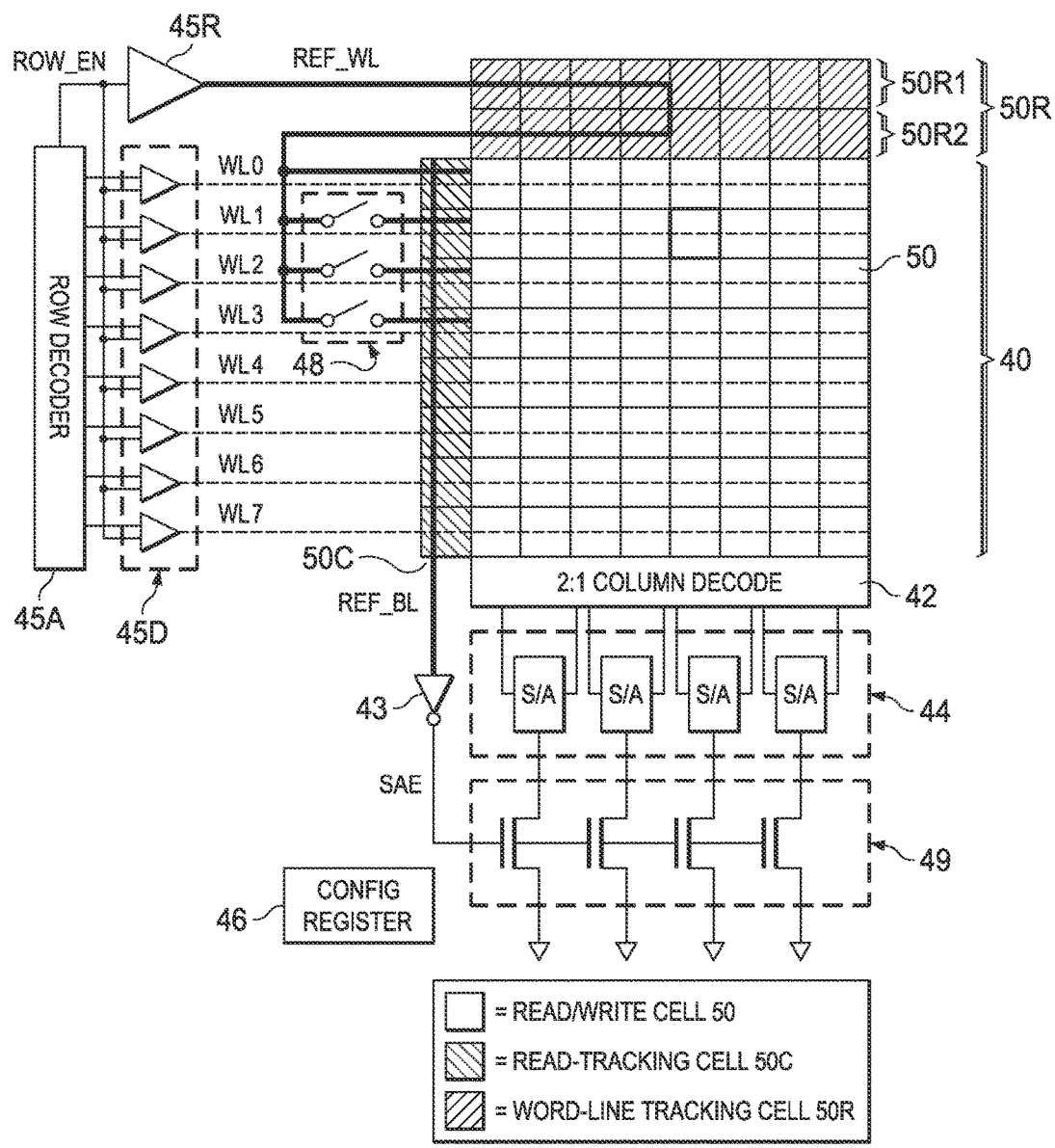
FIG. 4 is an electrical and layout diagram, in block and schematic form, illustrating an arrangement of a memory array in the memory resource of FIG. 3, according to an embodiment of the invention.

FIG. 4 illustrates, in further detail, the layout, interconnection, and operation of word-line reference cells 50R and read-tracking cells 50C with memory array 40 in generating the timing of sense amplifier enable signal SAE according to an embodiment of the invention. This example of array 40 includes a sub-array of eight rows and eight columns of read/write memory cells 50, each constructed as a conventional six-transistor SRAM cell as described above relative to FIG. 1*a*. Of course, read/write cells 50 may alternatively be constructed as 8-T, 10-T, or in another arrangement as desired. Each row of read/write cells 50 is associated with one of word lines $WL_0$ through $WL_7$, each of which is driven by one of word line drivers 45D in response to the row portion of the memory address decoded by row decoder 45A, gated by row enable signal ROW_EN. Each of read/write cells 50 includes pass transistors that are turned on by its associated word line $WL_0$ through $WL_7$ when selected, to couple its storage nodes to a pair of bit lines (not shown) associated with the column in which the cell 50 resides, in the conventional manner.

In this example, 2:1 column decode 42 selects one of two bit line pairs for coupling to one of sense amplifiers 44, for example in response to the least significant bit of the column portion of the memory address. In this embodiment of the invention, sense amplifier 44 amplifies and latches the differential voltage across the selected bit line pair, when enabled by its associated enable transistor 49. Enable transistors 49 each have a source/drain path connected between its associated sense amplifier 44 (e.g., at the source nodes of its driver transistors as described above relative to FIG. 1*a*) and a bias or reference voltage, which in this case is ground voltage $V_{ssa}$. The gates of enable transistors 49 receive sense amplifier enable signal SAE, as shown in FIG. 4.

In the example of FIG. 4, two rows 50R1, 50R2 of word-line reference cells 50R are disposed along the top side of the sub-array of read/write memory cells 50. Word-line reference cells 50R may be constructed similarly as read/write cells 50, for example as 6-T SRAM cells. However, none of word-line reference cells 50R are connected to any of bit lines BLT[n-1:0], BLB[n-1:0], considering that word-line reference cells 50R will be energized by reference word line REF_WL in the every cycle in which one of word lines $WL_0$ through $WL_7$ is also energized. In the embodiment shown in FIG. 4, reference word line REF_WL is driven by reference word line driver 45R in response to row enable signal ROW_EN. The drive characteristics of reference word line driver 45R match that of one of word line drivers 45D in this example. Row enable signal ROW_EN is also applied to each of word line drivers 45D, and gates the timing at which the selected one of word lines $WL_0$ through $WL_7$ is energized in a read cycle. As such, reference word line REF_WL is energized by reference word line driver 45R in every read cycle.

In this embodiment, reference word line REF_WL is connected to pass transistors in half of the word-line tracking cells 50R in one row 50R1 (e.g., four cells 50R in a row of eight), and to pass transistors in half of the word-line reference cells 50R in the second row 50R2. These connections to word-line tracking cells 50R are at points along reference word line REF_WL between reference word line driver 45R and read-tracking cells 50C. As a result, the capacitive loading of reference word line REF_WL is the equivalent of that of a full row of read/write memory cells (i.e., the gates of two pass transistors in each of the cells of a full row), and its resistance at the point at which it is received by read-tracking cells 50C matches that of the full length of one of word lines $WL_0$ through $WL_7$. As such, the signal level and timing at the end of reference word line REF_WL received by read-tracking cells 50C, matches that at the end of the energized one of word lines $WL_0$ through $WL_7$. The timing of the energizing of read-tracking cells 50C by reference word line REF_WL, and also the drive characteristics of that energizing, therefore mimics tracks the timing and drive characteristics of one of word lines $WL_0$ through $WL_7$.

Figure 5:
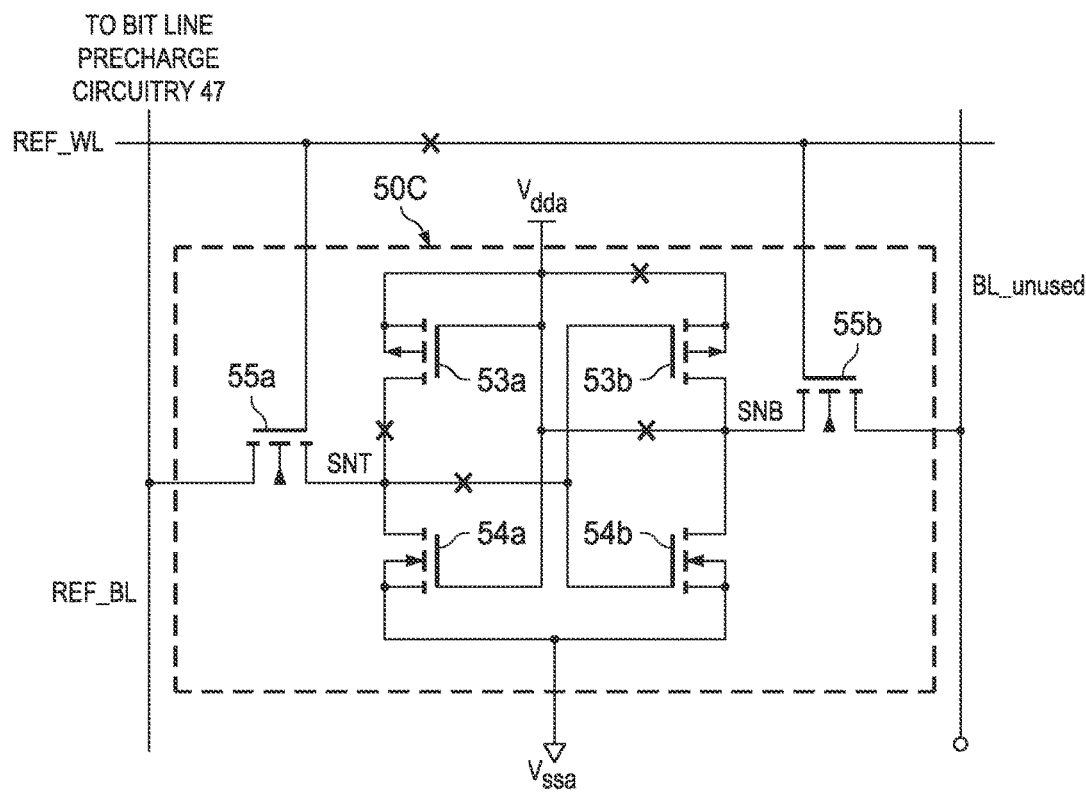
FIG. 5 is an electrical diagram, in schematic form, of a read-tracking cell in the memory resource of FIG. 3, according to an embodiment of the invention.

The construction of an example of one of read-tracking cells 50C is illustrated in FIG. 5. As evident in FIG. 5, read-tracking cell 50C is constructed as a six-transistor (6-T) SRAM cell based on cross-coupled inverters, in the conventional manner. One inverter includes p-channel load transistor 53*a* and n-channel driver transistor 54*a* with their gates connected together, and the other inverter includes p-channel load transistor 53*b* and n-channel driver transistor 54*b* with their gates connected together to the common drain node of transistors 53*a*, 54*a* at storage node SNT. The gates of transistors 53*a*, 54*a* are connected together and to the common drain node of transistors 53*b*, 54*b* at storage node SNB. Storage nodes SNT, SNB are coupled, by way of pass transistors 55*a*, 55*b* to reference bit line REF_BL and unused bit line BL_unused, respectively; the gates of pass transistors 55*a*, 55*b* receive reference word line REF_WL. As such, read-tracking cell 50C is constructed similarly as any one of read/write cells 50, with transistors 53, 54 in read-tracking cells 50C preferably identical in construction to corresponding transistors in read/write cells 50. However, read-tracking cell 50C differs from read/write cells 50 in that it is set to a fixed data state of "0" by the hard-wiring of the gates of its transistors 53*a*, 54*a* to power supply voltage $V_{dda}$. This hard-wiring maintains load transistor 53*a* off and driver transistor 54*a* on, forcing a low logic level at storage node SNT. Unused bit line BL_unused may be precharged by bit line precharge circuitry 47, but is otherwise not connected to other circuitry in RAM 38. Alternatively, read-tracking cells 50C may be pre-written with a given data state (e.g., "0") following power-up, or may be asymmetrically constructed to preferably attain one data state on power-up, or may otherwise be set to a known data state.

Options in the layout and construction of read-tracking cell 50C are also indicated in FIG. 5 by the "X" indicators overlying certain conductors. For example, the word line connected to the gate of pass transistor 55*b* need not be connected to reference word line REF_WL; indeed, pass transistor 55*b* may receive one of word lines WL[m-1:0] corresponding to its physical row if desired, considering that it is connected to unused bit line BL_unused. In addition, the common drain node of transistors 53*b*, 54*b* may be isolated from the gates of transistors 53*a*, 54*a*, the source of load transistor 53*b* may be disconnected from power supply voltage $V_{dda}$, and indeed the drain of load transistor 53*a* may be disconnected from storage node SNT. To minimize proximity effects on neighboring cells, some or all of these disconnections may be made, in many cases, by eliminating contacts between conductors in different physical levels.

In operation, upon assertion of reference word line REF_WL in a read cycle, the low logic level at storage node SNT resulting from the hard-wiring of the gates of transistors 53*a*, 54*a* to power supply voltage $V_{dda}$ will discharge reference bit line REF_BL toward reference voltage $V_{ssa}$. At the time that reference bit line REF_BL reaches a low logic level, inverting buffer 43 will drive sense amplifier enable signal SAE to a high logic level, turning on enable transistors 49 and initiating the sense operation by sense amplifiers 44 (shown in FIG. 4).

Referring back to FIG. 4 and according to this embodiment of the invention, reference word line REF_WL, after its routing to word-line tracking cells 50R, can be applied to multiple read-tracking cells 50C in the same column. In this particular example, reference word line REF_WL is hard-wired to one such read-tracking cell 50C, and is coupled to three other read-tracking cells 50C by way of configuration switches 48. This ganging of read-tracking cells 50C essentially averages the read current of the accessed ones of read-tracking cells 50C, so that the timing of sense amplifier enable signal SAE is not overly dependent on only one such cell. In addition, according to this embodiment, the timing of sense amplifier enable signal SAE can be trimmed by the particular value written into configuration register 46, which sets the number of read-tracking cells 50C that are to receive reference word line REF_WL and thus the current level discharging reference bit line REF_BL. Configuration register 46 may have multiple locations, to allow for varying numbers of read-tracking cells 50C to receive reference word line REF_WL depending on the desired operation. For example, one location of configuration register 46 may store the number of read-tracking cells 50C to receive reference word line REF_WL in normal operation, while another location of configuration register 46 may store the number of read-tracking cells 50C to receive reference word line REF_WL in a test mode.

Figure 6:
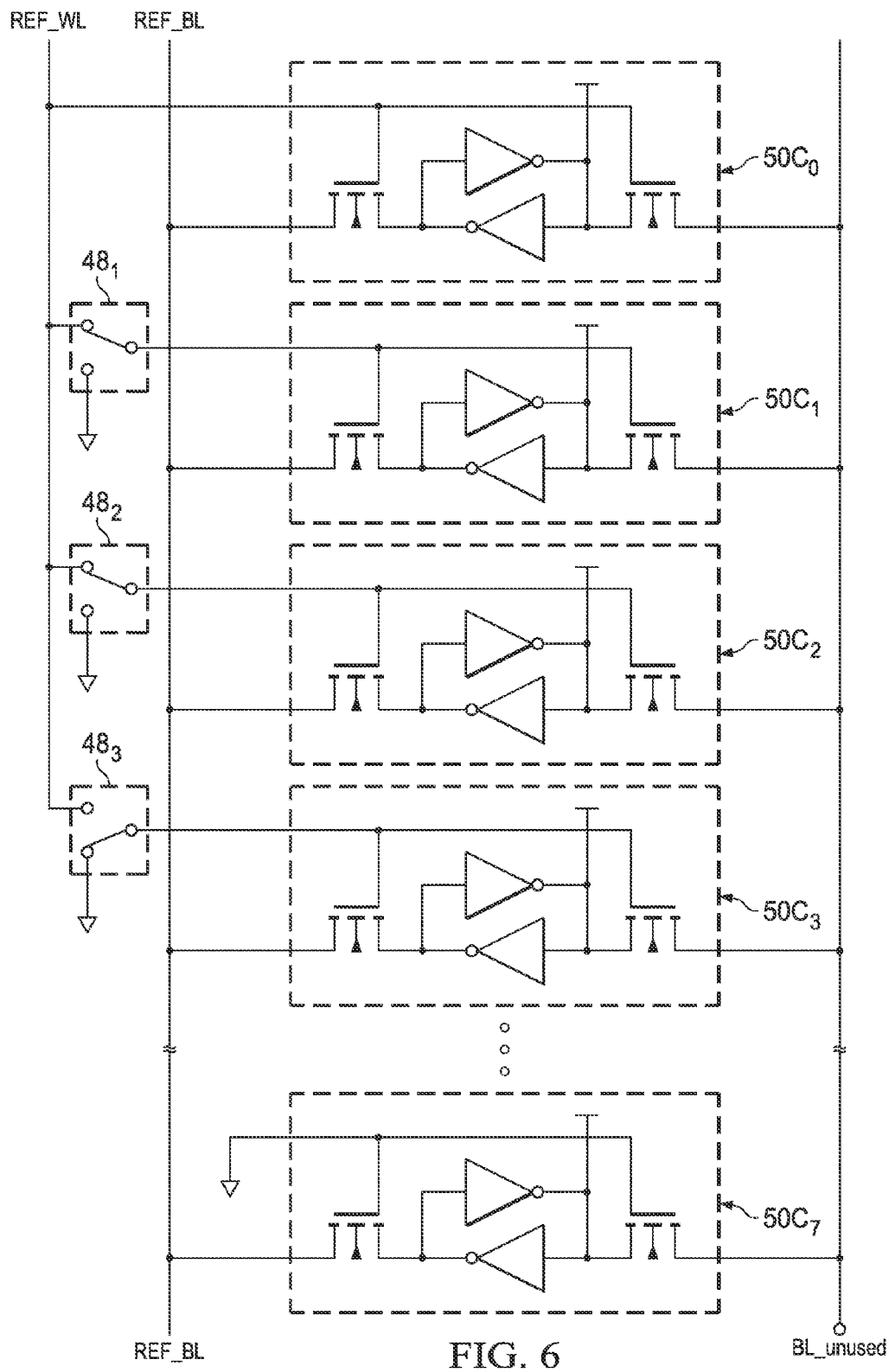
FIG. 6 is an electrical diagram, in schematic form, of a column of read-tracking cells in the memory resource of FIG. 3, according to an embodiment of the invention.

FIG. 6 schematically illustrates the arrangement of the column of read-tracking cells $50C_0$ through $50C_7$ in this embodiment of the invention. In this example, read-tracking cell $50C_0$ is in the same physical row as read/write cells 50 associated with word line $WL_0$, read-tracking cell $50C_1$ is in the same physical row as read/write cells 50 associated with word line $WL_1$, and so on. Each of read-tracking cells $50C_0$ through $50C_7$ is constructed similarly in this example, but can differ from one another in the connection of their pass transistors 55a, 55b to reference word line REF_WL. In this example, read-tracking cell $50C_0$ has the gates of its pass transistors 55 connected directly to reference word line REF_WL. Read-tracking cells $50C_1$ through $50C_3$ have the gates of their pass transistors coupled to reference word line REF_WL via configuration switches $48_1$ through $48_3$, respectively. Other read-tracking cells 50C in this column, as shown by read-tracking cell $50C_7$ by way of example, are similarly constructed as 6T SRAM cells to not disturb the photolithographic regularity of adjacent read/write cells 50, but have the gates of their pass transistors hard-wired to ground.

Configuration switches $48_1$ through $48_3$ are shown functionally in FIG. 6 as selectively connecting the pass transistors of their associated read-tracking cells $50C_1$ through $50C_3$ either to reference word line REF_WL or to ground, depending on the state of configuration register 46. In this example, configuration switches $48_1$ and $48_2$ are coupling read-tracking cells $50C_1$ and $50C_2$ to reference word line REF_WL, resulting in three read-tracking cells $50C_0$ through $50C_2$ that will discharge reference bit line REF_BL in a read cycle. In this case in which more than one configuration switch 48 is coupling reference word line REF_WL to its read-tracking cells 50C, those cells 50C will discharge reference bit line REF_BL in parallel in response to the energizing of reference word line REF_WL. Configuration switch $48_3$ is coupling the gates of pass transistors in read-tracking cell $50C_3$ to ground, ensuring that the timing of sense amplifier enable signal SAE is not affected by current through those pass transistors.

In any case, it is contemplated that configuration switches $48_1$ through $48_3$ may be realized by way of pass transistors or a logic function, by way of which the signal at the end of reference word line REF_WL is selectively applied to or isolated from read-tracking cells 50C, for example responsive to the state of writeable bits in configuration register 46. The number of configuration switches 48, and thus the number of read-tracking cells 50C that are available to discharge reference bit line REF_BL can range from one to four for the read-tracking cells 50C in the column.

As known in the art, memory arrays such as array 40 of RAM 38 involve a relatively large area of similar structures (i.e., memory cells 50), and as such are typically constructed in a very regular fashion. Especially at the deep sub-micron feature sizes (e.g., gate widths of 90 nm and below) now used in modern integrated circuits, this regularity reduces variation in transistor performance caused by "proximity effects", as known in the art. Conversely, memory cells that are at the edges of a regular memory array are necessarily in a different structural context than those in the center of the array, and will vary in their transistor performance as compared with cells interior to the array. For example, a higher preponderance of data storage failures (failed read or failed write) has been observed for memory cells at array edges as compared with interior cells. A conventional approach for addressing this device variation between array edge cells and array interior cells is to construct "dummy" memory cells around the edges of the memory array. These dummy cells are constructed similarly as the memory cells themselves, but are not electrically connected and are not used to store data. Rather, these dummy cells are sacrificial in the sense that they absorb proximity effects caused by the different structures located outside of the memory array. In some embodiments, these dummy cells may be constructed as incomplete memory cell structures (e.g., half-cells), if such would be sufficient to buffer the photolithographic and context effects from the "live" memory cells.

In addition, also as known in the art, some memory cell layouts have been made more efficient, from the standpoint of chip area, by the sharing of contacts, such as bit line contacts, by and between adjacent cells. For example, two memory cells that are in the same column (i.e., that connect to the same bit lines) but different rows can share a single bit line contact to connect their pass transistors to a common bit line. Because at most only one of the pass transistors will be on in a given cycle, no data conflict is cause by the shared bit line contact.

Figure 7A:
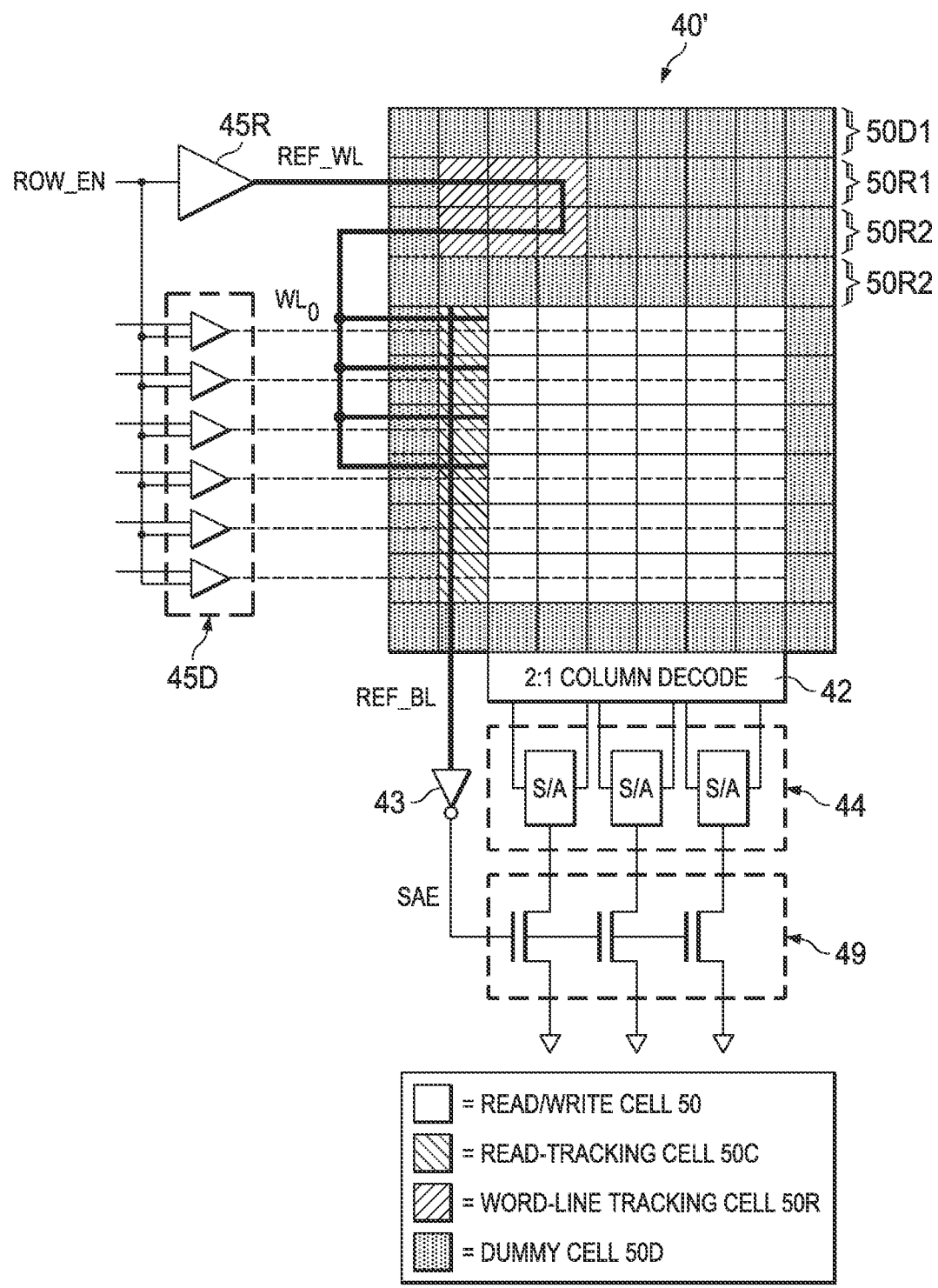
FIGS. 7a and 7b are electrical and layout diagrams, in block and schematic form, illustrating arrangements of a memory array in the memory resource of FIG. 3, according to alternative embodiments of the invention.

FIG. 7a illustrates a generalized layout of memory array 40' according to another embodiment of the invention. Components in the layout of FIG. 7 that are similar to those described above are referred to by the same reference numerals as in FIG. 4. In this example, six rows and six columns of read/write cells 50 are provided, along with one column of read-tracking cells 50C and two partial rows 50R1, 50R2 of word-line tracking cells 50R. Reference word line REF_WL extends over three word-line tracking cells 50R in row 50R1, and over three word-line tracking cells 50R in row 50R2.

The layout of FIG. 7a also includes dummy cells 50D disposed in an additional row and additional columns around the perimeter of array 40', for absorbing proximity effects at array edges. Each dummy cell 50D includes at least some transistors and other structures that are similarly constructed and laid out as in read/write cells 50, but that are not electrically connected into the active circuitry within or supporting array 40'. In addition, another row of dummy cells 50D is provided in row 50D2 of array 40', between second partial row 50R2 and the top row of read/write cells 50, to account for the sharing of bit line contacts between adjacent cells in the same column but different rows. Dummy cells 50D are also used to fill out the cell locations in rows 50R1, 50R2 beyond the routing of reference word line REF_WL. In this example, dummy cells 50D in row 50D2 are constructed identically as read/write cells 50 (and word-line reference cells 50R), but with a word line that is connected to ground voltage $V_{ssa}$, to eliminate spurious "data" from these cells on their associated bit lines. This construction permits the layout of word-line reference cells 50R to be identical with that of read/write cells 50 except that contact (or a via) to the actual and reference bit lines is removed for these cells and for cells in another row (namely row 50D2) with which word-line reference cells 50R share bit line contacts. Word-line reference cells 50R cannot share bit line contacts with the top row of read/write cells 50, because read/write cells 50 must connect to an actual bit line pair, while word-line reference cells 50R must connect to no bit line, considering that reference word line REF_WL is energized in every read cycle.

In this embodiment of the invention, dummy cells 50D are not required between the column of read-tracking cells 50C and the first column of read/write cells 50, but only around the perimeter of array 40. However, it is contemplated that some cell layouts may also share contacts between cells 50 in adjacent columns, for example word line contacts, power supply ($V_{dda}$, $V_{ssa}$) contacts, and the like. In those cases, the layout of read-tracking cells 50C may necessitate insertion of a column of dummy cells 50D between the column of read-tracking cells 50C and the first column of read/write cells 50. This additional column of dummy cells 50D may also be inserted if it is desired to buffer the first column read/write cells 50 from layout perturbations of read-tracking cells 50C.

Accordingly, the layout of FIG. 7a provides the benefit of efficient chip area implementation of both word-line and read tracking into the circuitry for generating sense amplifier enable signal, including the ability to construct the memory array using shared bit line contacts between adjacent rows, and also incorporating dummy cells to eliminate proximity effects. It is contemplated, in this regard, that the tradeoff between the chip area required for the implementation of the row of dummy cells 50D and the chip area saved by sharing bit line contacts favors the arrangement shown in FIG. 7, in this example.

Figure 7B:
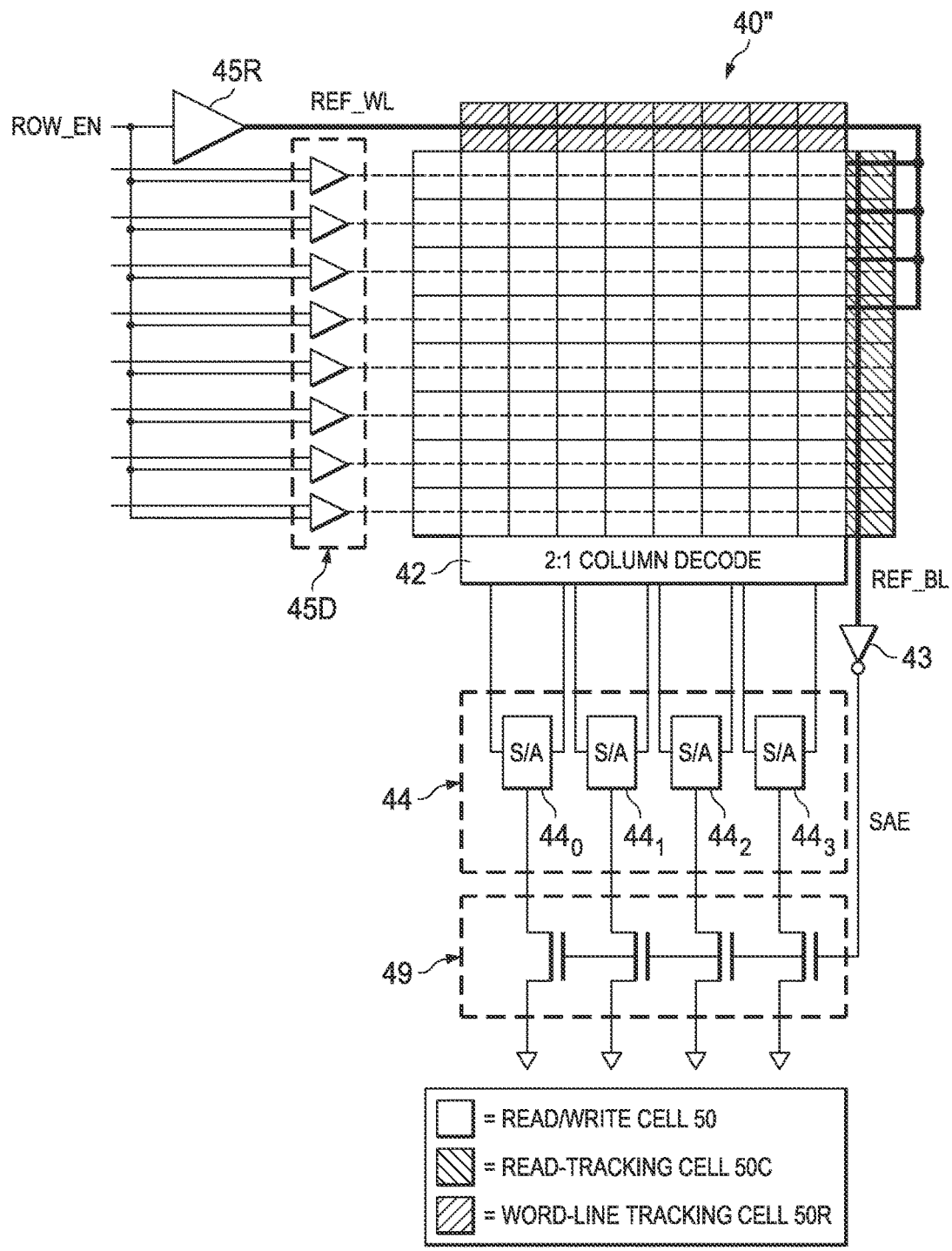

FIG. 7b illustrates memory array 40" according to another alternative embodiment of the invention. In this realization, memory array 40" is constructed similarly as memory array 40 described above relative to FIG. 4, but with read-tracking cells 50C and reference bit line REF_BL disposed on an opposite side of read/write cells 50 from word line drivers 45D. Because of that arrangement, reference word line REF_WL extends across a full single row of word-line tracking cells 50R, rather than doubling back over two partial rows of word-line tracking cells 50R as in FIGS. 4 and 7a. In this layout, the signal at the far end of reference word-line REF_WL is subject to the capacitive loading of a full row of read/write cells 50 and the full resistance of the length of a word line WL, at which point reference word line REF_WL connects to pass transistors in read-tracking cells 50C.

It is contemplated that this arrangement may be realized in reduced chip area in some implementations. However, in this arrangement, the sense amplifier enable signal SAE timing signal will be communicated in an opposite direction from that in which the selected word line $WL_m$ is driven from row drivers 45D. The timing of sense amplifier enable signal SAE at sense amplifier $44_3$ (nearest buffer 43) relative to the time at which its selected cell 50 receives the active high level on its word line $WL_m$ (at the far end of word line $WL_m$ from row drivers 45D) will be earlier than the timing of sense amplifier enable signal SAE at sense amplifier $44_0$ (farthest from buffer 43) relative to the time at which its selected cell 50 receives the active high level on its word line $WL_m$ (at the near end of word line $WL_m$ from row drivers 45D), requiring the insertion of additional margin into the sense amplifier timing of the design. In addition, some memory compilers used in modern design automation systems may enforce a preference for sense amplifier enable signal SAE and word lines WL[m-1:0] to be driven from the same side of array 40. It is contemplated that those skilled in the art having reference to this specification will be readily able to evaluate the tradeoffs involving sense amplifier timing margin, chip area savings, and design automation effort, in selecting a particular embodiment or variation thereof for specific implementations.

The layout of array 40" in FIG. 7b may also include dummy cells 50D around its perimeter to reduce edge proximity effects, and also a row of dummy cells 50D between word-line tracking cells 50R and the top row of read/write cells 50 if shared bit line contacts are used, as in the layout of FIG. 7a described above.

It is further contemplated that other variations and alternatives in the layout and construction of a memory array and memory circuitry will be apparent to those skilled in the art having reference to this specification, such variations and alternatives being within the scope of the invention as claimed.

As mentioned above, embodiments of the invention can provide important advantages and benefits in the construction and operation of integrated circuits including memory resources. These benefits include the accurate mimicking and close tracking of the sense amplifier timing in the memory, according to the farthest memory cell in a row from the word line drivers, by making the sense amplifier timing responsive to the charging of the reference word line over the equivalent length of a full row. Embodiments of this invention also generate the sense amplifier timing in a manner that also mimics and tracks the read current of memory cells, with the timing of that reference read current driven by the reference word line response over its full length. It is contemplated that the timing of the sense amplifier enable will closely track changes in the electrical characteristics of live cells in memory array over variations in manufacturing process parameters, voltage, temperature, and other conditions, because of the embedding of both the word-line tracking cells and the read-tracking cells in the memory array. The construction of the tracking cells can also be made similar if not identical to that of the read/write cells in the array, with such construction being specific to each compiled instance of a memory resource in a larger-scale integrated circuit such as a system-on-a-chip (SoC). In addition, as will also be apparent from the description below, this excellent tracking can be attained efficiently from the standpoint of chip area, according to embodiments of this invention.

While this invention has been described according to certain of its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An integrated circuit comprising a solid-state memory, the solid-state memory comprising:
   a memory array, comprising:

a sub-array of read/write memory cells arranged in rows and columns, each row of read/write memory cells coupled to an associated word line, and each column of read/write memory cells coupled to an associated pair of bit lines;

a plurality of word-line tracking memory cells disposed along a first side of the sub-array, each having a transistor gate coupled to a reference word line; and a plurality of read-tracking memory cells disposed along a second side of the sub-array, each comprising a pass transistor having a conduction path between a reference storage node and the reference bit line, and having a gate;

a row decoder, for decoding a row address received by the solid-state memory;

a plurality of word line drivers, each for driving an associated selected word line responsive to the decoded row address and to a row enable signal;

a reference word line driver, connected to the reference word line, for driving the reference word line responsive to the row enable signal;

wherein the gates of the read-tracking memory cells are coupled to the reference word line at a point from the reference word line driver beyond locations at which the reference word line is coupled to the word-line tracking memory cells;

the memory further comprising:
a plurality of sense amplifiers, each coupled to a pair of bit lines; and
a plurality of enable transistors, each having a conduction path coupled between one of the plurality of sense amplifiers and a reference voltage, and having a gate coupled to the reference bit line.

2. The memory of claim 1, wherein the plurality of read-tracking memory cells are arranged in a column along the second side of the sub-array; and wherein the plurality of word-line tracking memory cells are arranged in at least one row along the first side of the sub-array.

3. The memory of claim 2, wherein the column of read-tracking memory cells is disposed adjacent to a column of read/write memory cells in the sub-array.

4. The memory of claim 2, further comprising:
a first row of dummy memory cells disposed adjacent to a row of read/write memory cells in the sub-array; and
wherein the row of word-line tracking memory cells is disposed adjacent to the row of dummy memory cells.

5. The memory of claim 2, further comprising:
a plurality of dummy memory cells comprising:
a first row of dummy memory cells disposed adjacent to a row of read/write memory cells in the sub-array, and between the row of read/write memory cells and the row of word-line tracking memory cells;
a second row of dummy memory cells disposed adjacent to and on an opposite side of a row of word-line tracking memory cells from the first row of dummy memory cells;
a first column of dummy memory cells disposed adjacent to a column of read/write memory cells, on an opposite side of the sub-array from the read-tracking memory cells; and
a second column of dummy memory cells disposed adjacent to the column of read-tracking memory cells.

6. The memory of claim 5, wherein the column of read-tracking memory cells is disposed adjacent to a column of read/write memory cells in the sub-array.

7. The memory of claim 1, wherein the plurality of word-line tracking memory cells are arranged in first and second rows; wherein the reference word line extends from the row driver over the first row of word-line tracking memory cells for a distance shorter than the length of the sub-array in that direction, and extends back in a direction toward the row driver over the second row of word-line tracking memory cells.

8. The memory of claim 1, wherein the plurality of word-line tracking memory cells are arranged in a single row.

9. The memory of claim 1, wherein each of the read/write memory cells is a static random-access memory cell.

10. The memory of claim 1, further comprising:
a configuration register for storing a digital value indicating a number of read-tracking memory cells coupled to the reference word line.

11. The memory of claim 1, further comprising:
a buffer having an input coupled to the reference bit line and an output coupled to the gate of each of the plurality of enable transistors.

12. A method of reading data from a solid-state memory array, the memory array comprising a sub-array of read/write memory cells arranged in rows and columns, comprising the steps of:
precharging a reference bit line;
decoding a row address portion of a memory address;
asserting a row enable signal;
responsive to the asserting step, driving a word line associated with a row of read/write memory cells corresponding to the decoded row address;
responsive to the asserting step, energizing a reference word line from a first end, the reference word line coupled to a plurality of word-line tracking memory cells disposed in the array near the sub-array, a second end of the reference word line disposed beyond the word-line tracking memory cells and coupled to a plurality of read-tracking memory cells disposed in the array near the sub-array;
responsive to receiving an active voltage level at the plurality of read-tracking memory cells, discharging the reference bit line; and
responsive to the discharging of the reference bit line, enabling at least one sense amplifier coupled to a pair of bit lines associated with a column of the read/write memory cells.

13. The method of claim 12, wherein the enabling step comprises:
turning on an enable transistor having a conduction path coupled between an associated sense amplifier and a bias voltage.

14. The method of claim 12, wherein the read/write memory cells in each column are associated with a pair of bit lines; and
wherein the read/write memory cells each comprise a pair of pass transistors, each having a conduction path coupled between a storage node and one of the pair of bit lines associated with its column, and having a gate coupled to the word line associated with its row;
and further comprising:
prior to the step of driving a word line, precharging each pair of bit lines.

15. The method of claim 14, further comprising:
responsive to the driving step, turning on the pass transistors of each of the read/write memory cells in the row corresponding to the decoded row address; and wherein one of the pair of bit lines associated with each read/write memory cell in the row corresponding to the decoded row address is discharged responsive to the turning on of the pass transistors in that read/write memory cell.

16. The method of claim 12, further comprising:
writing, into a first location of a configuration register, a digital value indicating a first number of read-tracking memory cells to be coupled to the reference word line.

17. The method of claim 16, further comprising:
writing, into a second location of the configuration register, a digital value indicating a second number of read-tracking memory cells coupled to the reference word line;

in a normal operating mode, coupling the number of read-tracking cells indicated by the first location of the configuration register to the reference word line; and in a test mode, coupling the number of read-tracking cells indicated by the second location of the configuration register to the reference word line.

\* \* \* \* \*